Sept. 29, 1959 K. E. RAITHEL 2,906,930

CRYSTAL RECTIFIER OR CRYSTAL AMPLIFIER

Filed March 23, 1955

INVENTOR.
KURT E. RAITHEL
BY R. P. Morris
ATTORNEY 2,906,930
Patented Sept. 29, 1959

2,906,930

CRYSTAL RECTIFIER OR CRYSTAL AMPLIFIER

Kurt E. Raithel, Erlangen-Land, Germany, assignor to International Standard Electric Corporation, New York, N.Y., a corporation of Delaware Application March 23, 1955, Serial No. 496,279

Claims priority, application Germany April 7, 1954

6 Claims. (Cl. 317—234)

This invention relates to junction type crystal rectifiers and amplifiers in which the junction is formed by diffusion of metal or alloy which also serves as a means for attaching the connecting wire or terminal.

In manufacturing devices of the type hereinbefore described, a metal or an alloy is deposited onto a semiconductor of a predetermined conductivity type which upon being heated over the melting point will diffuse into the original semi-conductor down to a certain depth thus producing a change of the type of conductivity and a so-called "p-n transition." Such deposited metals or alloys are termed herein "alloyed" or "diffused" electrodes. Such alloyed electrodes in common practice are employed in the form of a small amount of metal deposited on the semi-conductor plate and melted to a metal drop. A very thin layer of the metal of the alloyed electrode is already spread during the alloying process over the surface of the semi-conductor to such an extent that the p-n transition is short-circuited thereby, but this thin layer can be easily removed by etching thereby eliminating the short-circuit. Difficulty arises however when the connecting wire is to be attached to this drop, for the whole drop is spread over the surface of the semi-conductor plate to such an extent when the connecting wire is being applied thereto that the p-n transition which has been produced is short-circuited thereby rendering the device useless, and this short circuit can no longer be eliminated by means of etching. It is not desirable to use an extremely thin connecting wire to lessen this spreading because such a wire would be incapable of transferring or removing the heat generated in the device. A good transfer of the heat, developed at the p-n transition, is necessary because the load capacity of the device depends on this to a considerable extent.

In accordance with the present invention the above difficulties are overcome by using a connecting wire which is almost or nearly of the same cross section as the alloyed zone and is so designed as to absorb the alloy metal of the drop. Thus both good heat conduction is provided by the connecting wire while preventing a spreading-out of the liquid metal of the alloyed electrode and its consequent short-circuiting of the p-n transition.

However, the semiconductor can also be designed in such a way that its cross-section corresponds to that of the alloyed zone. This means that the cross section of the semiconductor at the contact area with the alloyed electrode has the same size like the alloyed area. In this case, the total upper surface of the semiconductor is coated with the metal to be alloyed into the semiconductor. In this way there will likewise be prevented a spreading out of the alloyed electrode metal and a short-circuiting of the p-n transition.

The above-mentioned and other features and objects of this invention and the manner of attaining them will become more apparent and the invention itself will be best understood, by reference to the following description of an embodiment of the invention taken in conjunction with the accompanying drawings, wherein.

Figure 1:
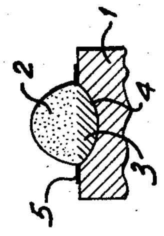

Referring now to Fig. 1, the semi-conductor plate 1 may consist for example of germanium or silicon. On this semiconductor plate there is deposited a small amount of an alloy or a metal which, when alloyed with the plate produces a change of the conductivity character of the semiconductor plate 1. When using, for instance, for the semiconductor plate 1, n-germanium, then for example indium may be employed for the alloyed electrode 2. By heat treatment the material of the alloyed electrode 2 is melted to form a drop and then alloyed with the germanium. The alloyed zone 3 is indicated by hatchlines. A very slight amount of the material of the alloyed electrode 2 will be spread over the surface of the semiconductor 1, as is denoted at point 5. This causes a short-circuit of the p-n transition 4. By means of a subsequent etching process this thin layer 5 can be easily removed.

Figure 2:
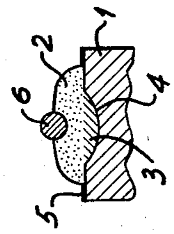
Figs. 1 and 2 are cross-sectional views of a device of the type referred to hereinabove used in describing the prior art.
Figure 3:
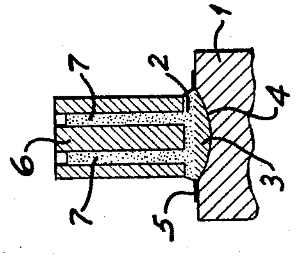

If it is now tried to insert a somewhat thick metal connecting wire 6 into the liquid drop of metal 2, as is shown in Fig. 2, then the drop will be spread at the side over the p-n layer 4, which is the cause of a permanent short-circuit, because this short-circuit cannot be eliminated by etching. Since the transition zone in many cases only has thickness of $10^{-5}$ cm., only very thin connecting wires can be inserted in the liquid drop of metal alloy if a short-circuit is supposed to be prevented thereby. However, this again represents an obstacle to the heat transfer from the p-n transition 4.

Figs. 3–8 show some exemplified embodiments of the present invention. Through the cavities provided in the connecting wire the metal of the alloyed electrode can easily penetrate by capillary action, or surface tension, into it and therefore, the liquid metal drop of the alloyed electrode will not spread out when attaching the wire; hence no short-circuit can be established. Since, at the same time, the cross-section of the wire is substantially the same as that of the alloyed zone, there is assured a good heat transfer from the p-n transition and a good electrical as well as mechanical contact. In the embodiment according to Fig. 3 the current supply connecting means or wire consists of a metal block 6, for example of copper, comprising a plurality of borings 7. On account of the capillarity attraction of these borings of capillary size, the liquid metal of the alloyed electrode 2 will rise in the borings 7 of the connecting wire 6 and is prevented from spreading over the surface of the alloyed zone 3. Furthermore, it is of importance that for the connecting wire there is chosen a material which is capable of being well wetted by the liquid metal of the alloyed electrode. In order to prevent a clogging or choking of the borings 7 of the metal block 6 it is appropriate to previously heat the metal block, prior to its application to the alloyed electrode, which, thereby, is in a liquid condition, up to a certain temperature. To effect a speedy setting or hardening of the metal of the alloyed electrode it is advisable to cool down the current supply means 6 directly thereafter.

Figure 4:
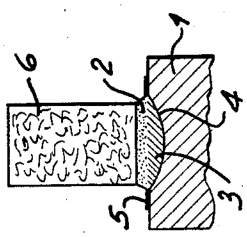

Fig. 4 shows another type of embodiment in which the current supply means consists of a sintered body 6. By the porous structure of the sintered body 6 the metal of the alloyed electrode 2 is likewise sucked up by capillary action.

Figure 5:
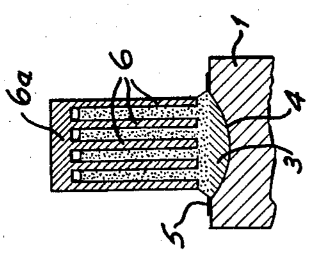

However, the current supply means may also consist of a bundle of wires 6, as is shown by way of example in Fig. 5, and which, for example by welding, is connected at one end to a metallic body *6a*. In this bundle of wires, consisting, for instance, of copper wires with a circular cross-section, there exist parallel channels, similar to the embodiment according to Fig. 3, into which the metal of the alloyed electrode 2 penetrates.

Figure 6:
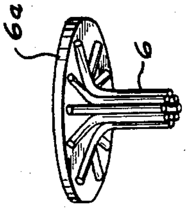
Fig. 6 is an elevational view of another modification of the present invention.

The connecting wire according to Fig. 5 consisting of a bundle of wires can also be designed in the shape shown in Fig. 6 to achieve a better heat transfer and heat radiation. As represented in Fig. 6 this consists of a metal plate *6a* to which, as by welding, there are attached a plurality of metal wires 6 in a radial manner and forming in the center a bundle of wires as shown in the embodiment according to Fig. 5 of the drawings.

Figure 7:
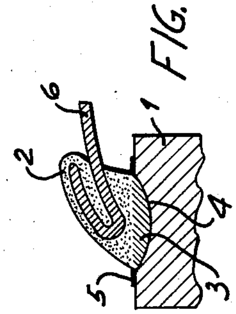
Figs. 3, 4, 5, 7 and 8 are similar views of different modifications according to the present invention.
Figure 8:
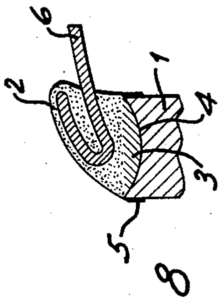

Furthermore, is is possible, that the connecting wire has the end which is to be connected with the alloyed electrode 2 bent to the shape of one or more wire loops, as is shown by way of example in Fig. 7 of the drawings.

A further progress can be achieved in that the semiconductor is provided at the alloying point with such a cross-section only, as has the molten drop of metal of the alloyed electrode. Such an arrangement is shown by way of example in Fig. 8.

Further advantages with the connecting wire can be achieved in that the surface thereof is roughened in a suitable way, as by etching. This can be effected either on the side facing the alloyed electrode and/or at the side of the jacketing surface and/or in the channels. However, in either case care has to be taken that only such a metal is used as the connecting wire which is also capable of being well wetted by the alloyed electrode and by means of which no impurities of any kind have access to the alloyed electrode 2. Accordingly, also at any probable roughening or etching of the surface of the connecting wire great care has to be taken that all impurities are removed from its surface after the etching or roughening respectively.

Similar effects as achieved by means of the thin channels in the inside of the wire, can also be obtained by grooves or by way of a suitable surface profile obtained e.g. by roughening the surface of the connecting wire.

After the connection of the connecting wire to the alloyed electrode and the cooling down, there will be effected an etching in order to remove the thin layer of the alloying metal from the surface of the semiconductor, thereby eliminating any possible remaining short-circuit.

By the term "connecting wire" as employed herein we refer to any means for connecting to the device and thus may include for example without limiting the breadth of the phrase, rods, bars, terminals, contact members of any shape or configuration within the limits defined in the claims and the like.

While I have described above the principles of my invention in connection with specific apparatus and modifications thereof, it is to be clearly understood that this description is made only by way of example and not as a limitation to the scope of my invention as set forth in the objects thereof and in the accompanying claims.

What is claimed is:

1. A circuit element comprising a crystal, an impurity blob in contact with, and covering a specific surface area of said crystal, and an electrode comprising at least two spaced parts in contact with said blob, the distance between parts being of capillary size, whereby the blob is drawn into the space without substantially increasing said specific area covered by said blob.

2. The circuit element according to claim 1, wherein the cross-sectioned area of said part of said electrode in contact with said blob is approximately equal to said specific surface area.

3. The circuit element according to claim 1, wherein said electrode consists of a metal block including a plurality of openings extending longitudinally from the area of contact, the openings being of a capillary size, whereby said blob in its molten state passes into said openings by capillary action.

4. The circuit element according to claim 1, wherein said electrode consists of a porous metallic body, the porous structure being such that the blob in its molten state passes into a portion of the openings in said porous structure.

5. The circuit element according to claim 1, wherein caid electrode consists of a plurality of wires spaced apart and joined together at one end by a metal plate, the free ends thereof being in contact with said blob, the spaces between said wires being of capillary size, whereby the blob in its molten state passes into said spaces by capillary action.

6. The circuit element according to claim 1, wherein said electrode comprises a wire having a loop at one end thereof, the loop being in contact with said blob and preventing said blob from extending beyond said surface area, by surface tension produced between the loop and the blob.

References Cited in the file of this patent

UNITED STATES PATENTS

| | | |
|---|---|---|
| 2,680,220 | Starr et al. | June 1, 1954 |
| 2,733,390 | Scanlon | Jan. 31, 1956 |
| 2,764,642 | Shockley | Sept. 25, 1956 |
| 2,796,562 | Ellis et al. | June 18, 1957 |